United States Patent
Ni et al.

(10) Patent No.: US 6,746,961 B2
(45) Date of Patent: Jun. 8, 2004

(54) PLASMA ETCHING OF DIELECTRIC LAYER WITH ETCH PROFILE CONTROL

(75) Inventors: Tuqiang Ni, Fremont, CA (US); Lumin Li, Santa Clara, CA (US)

(73) Assignee: Lam Research Corporation, Fremont, CA (US)

(*) Notice: Subject to any disclaimer, the term of this patent is extended or adjusted under 35 U.S.C. 154(b) by 92 days.

(21) Appl. No.: 09/883,207

(22) Filed: Jun. 19, 2001

(65) Prior Publication Data

US 2003/0045114 A1 Mar. 6, 2003

(51) Int. Cl.[7] ............................................. H01L 21/311
(52) U.S. Cl. .................. 438/700; 438/714; 438/723; 216/17; 216/67
(58) Field of Search .................. 438/706, 709, 438/712, 714, 723, 724, 734, 695; 216/67, 79

(56) References Cited

U.S. PATENT DOCUMENTS

| | | |
|---|---|---|
| 4,615,764 A | 10/1986 | Bobbio et al. |
| 5,013,398 A | 5/1991 | Long et al. |
| 5,013,400 A | 5/1991 | Kurasaki et al. |
| 5,021,121 A | 6/1991 | Groechel et al. |
| 5,022,958 A | 6/1991 | Favreau et al. |
| 5,269,879 A | 12/1993 | Rhoades et al. |
| 5,445,712 A * | 8/1995 | Yanagida ................. 156/662 |
| 5,529,657 A | 6/1996 | Ishii |
| 5,595,627 A | 1/1997 | Inazawa et al. |
| 5,611,888 A | 3/1997 | Bosch et al. |
| 5,820,261 A | 10/1998 | Yam |
| 5,882,535 A * | 3/1999 | Stocks et al. ................ 216/18 |
| 6,090,304 A | 7/2000 | Zhu et al. |
| 6,114,250 A * | 9/2000 | Ellingboe et al. ........... 438/709 |
| 6,117,786 A | 9/2000 | Khajehnouri et al. |
| 6,159,862 A * | 12/2000 | Yamada et al. ............ 438/712 |
| 6,191,043 B1 | 2/2001 | McReynolds |
| 6,403,488 B1 * | 6/2002 | Yang et al. ................ 438/706 |

* cited by examiner

Primary Examiner—Nadine G. Norton
Assistant Examiner—Duy Vu Deo
(74) Attorney, Agent, or Firm—Burns, Doane, Swecker & Mathis, LLP

(57) ABSTRACT

A semiconductor manufacturing process wherein high aspect ratio deep openings are plasma etched in a dielectric layer using an etchant gas which includes a fluorocarbon, a sulfur-containing gas, an oxygen-containing gas and an optional carrier gas. The etchant gas can include $C_xF_yH_z$ such as $C_4F_8$, $SO_2$, $O_2$ and Ar. The combination of the sulfur-containing gas and the oxygen-containing gas provides profile control of the deep openings.

20 Claims, 1 Drawing Sheet

PLASMA ETCHING OF DIELECTRIC LAYER WITH ETCH PROFILE CONTROL

FIELD OF THE INVENTION

The present invention relates to an improved method for plasma etching a dielectric layer in the fabrication of integrated circuits.

BACKGROUND OF THE INVENTION

A common requirement in integrated circuit fabrication is plasma etching of openings such as contacts, vias and trenches in dielectric materials. The dielectric materials include doped silicon oxide such as fluorinated silicon oxide (FSG), undoped silicon oxide such as silicon dioxide, silicate glasses such as boron phosphate silicate glass (BPSG) and phosphate silicate glass (PSG), doped or undoped thermally grown silicon oxide, doped or undoped TEOS deposited silicon oxide, organic and inorganic low-k materials, etc. The dielectric dopants include boron, phosphorus and/or arsenic. The dielectric can overlie a conductive or semiconductive layer such as polycrystalline silicon, metals such as aluminum, copper, titanium, tungsten, molybdenum or alloys thereof, nitrides such as titanium nitride, metal silicides such as titanium silicide, cobalt silicide, tungsten silicide, molybdenum silicide, etc.

Various plasma etching techniques for etching openings in silicon oxide are disclosed in U.S. Pat. Nos. 4,615,764; 5,013,398; 5,013,400; 5,021,121; 5,022,958; 5,269,879; 5,529,657;5,595,627; 5,611,888 and 6,159,862. The plasma etching can be carried out in medium density reactors such as the parallel plate plasma reactor chambers described in the '398 patent or the triode type reactors described in the '400 patent or in high density reactors such as the inductive coupled reactors described in the '657 patent. Etching gas chemistries include $SF_6$, $NH_3$ and an oxidizing component selected from $CO_2$, $O_2$, NO, $SO_2$ and $H_2O$ described in the '764 patent, the oxygen-free, Ar, $CHF_3$ and optional $CF_4$ gas mixture described in the '121 and '958 patents, the oxygen-free, fluorine-containing and nitrogen gas mixture described in the '879 patent, the $CF_4$ and CO gas mixture described in the '627 patent, the oxygen and $CF_4$ gas mixture described in the '400 patent, the oxygen, $CF_4$ and $CH_4$ gas mixture described in the '657 patent, and the Freon and neon gas mixture described in the '888 patent. The '862 patent describes a breakthrough procedure using Ar and $O_2$ or $CHF_3$ and $SO_2$ followed by etching $SiO_2$ using $C_5F_8$, $O_2$, a carrier gas and optionally CO.

Techniques to achieve profile control of deep openings having high aspect ratios of at least 5:1 are disclosed in commonly owned U.S. Pat. Nos. 6,117,786 and 6,191,043B1. Of these, the '786 patent describes etching of openings in silicon oxide layers using a gas mixture containing fluorocarbon, oxygen and nitrogen reactants wherein the oxygen and nitrogen are added in amounts effective to control the profile of the etched opening. The '043 patent describes etching of deep openings 10 to 15 μm deep in a silicon layer by using a chlorine-containing etch gas chemistry to etch through a native oxide layer over the silicon layer and using a gas mixture containing an oxygen reactant gas, helium, an inert bombardment-enhancing gas and a fluorine-containing gas such as $SF_6$, $C_4F_8$, $CF_4$, $NF_3$ and $CHF_3$ to etch ultra deep openings in the silicon layer.

As device geometries become smaller and smaller, it is becoming necessary to plasma etch deep and narrow openings in silicon oxide. Accordingly, there is a need in the art for a plasma etching technique which achieves such deep and narrow openings. Further, it would be highly desirable to achieve such opening geometries without bowing of the sidewalls of the openings.

SUMMARY OF THE INVENTION

The invention provides a process of etching openings in a dielectric layer with profile control, comprising the steps of supporting a semiconductor substrate having a dielectric layer thereon in a plasma etch reactor, supplying an etchant gas to the plasma etch reactor, energizing the etchant gas into a plasma state and etching openings in the dielectric layer, the etchant gas comprising $C_xF_yH_z$ wherein $x \geq 1$, $y \geq 1$ and $z \geq 0$, a sulfur-containing gas and an oxygen-containing gas, the sulfur-containing gas and the oxygen-containing gas being added in amounts effective for profile control of the etched openings.

The etched openings can comprise vias, contacts and/or trenches of a dual damascene, a self-aligned contact or self-aligned trench structure. During etching of such openings, the $C_xF_yH_z$ forms a protective sidewall polymer on the sidewalls of the etched openings, the sulfur-containing gas protects the sidewall polymer from excessive attack by the oxygen-containing gas and the oxygen-containing gas maintains a desired thickness of the sidewall polymer. In the case where the sulfur-containing gas is $SO_2$, undissociated $SO_2$ molecules react with polymer at the bottoms of the etched openings to prevent etch stop under bombardment of directional ions.

The plasma etch reactor can comprise an ECR plasma reactor, an inductively coupled plasma reactor, a capacitively coupled plasma reactor, a helicon plasma reactor or a magnetron plasma reactor. For instance, the plasma etch reactor can comprise a dual frequency capacitively coupled plasma reactor including an upper showerhead electrode and a bottom electrode, RF energy being supplied at two different frequencies to either the bottom electrode or at different first and second frequencies to the showerhead electrode and bottom electrode. In the case where the plasma etch reactor is a capacitively coupled plasma reactor, the reactor can have a powered showerhead electrode and a powered bottom electrode, the showerhead electrode being supplied 500 to 3000 watts of RF energy and the bottom electrode being supplied 500 to 3000 watts of RF energy.

According to a preferred embodiment, the sulfur-containing gas is $SO_2$ and the oxygen-containing gas is $O_2$, the $SO_2$ and $O_2$ being added in amounts effective to provide undissociated $SO_2$ molecules which react with polymer at bottoms of the etched openings to prevent etch stop under bombardment of directional ions. The ratio of flow rates of the sulfur-containing gas to the oxygen-containing gas can be 0.5:1 to 1.5:1. During the process, pressure in the plasma etch reactor can be 5 to 200 mTorr and/or temperature of the substrate support can be −20° C. to +80° C. The etchant gas can include a carrier gas selected from the group consisting of He, Ne, Kr, Xe and Ar, the carrier gas being supplied to the plasma etch reactor at a flow rate of 5 to 1000 sccm.

The $C_xF_yH_z$ gas can be a mixture of hydrogen-containing and hydrogen-free fluorocarbon gases supplied to the plasma etch reactor at a total flow rate of 5 to 100 sccm. The sulfur-containing gas preferably consists of $SO_2$ and the oxygen-containing gas preferably consists of $O_2$, each of the $SO_2$ and $O_2$ gases being supplied to the plasma etch reactor at a flow rate of 1 to 30 sccm. In the case where the dielectric layer is BPSG, the etchant gas can include $SO_2$ and $O_2$ supplied to the plasma etch reactor with flow rates providing a $SO_2$:$O_2$ flow rate ratio of 1:2 to 2:1.

In the process of the invention it is possible to obtain etched openings 0.30 μm or smaller having substantially straight profiles wherein top, middle and bottom critical dimensions of the openings are substantially the same, and the openings have an aspect ratio of at least 5:1. The dielectric layer can consist of a single material or a stack of layers such as low-k materials with or without etch stop layers therebetween. The openings can be etched to depths of at least 2 μm or at least 3 μm and an RF bias can be applied to the semiconductor substrate during the etching step. For example, the etched openings can be 0.25 μm or smaller sized openings having substantially straight profiles wherein top, middle and bottom critical dimensions of the openings are substantially the same, and the openings have an aspect ratio of at least 10:1.

A preferred etchant gas includes $C_4F_8$, $SO_2$, $O_2$ and Ar supplied to the plasma etch reactor at flow rates of 5 to 30 sccm $C_4F_8$, 2 to 15 sccm $SO_2$, 2 to 15 sccm $O_2$, and 300 to 600 sccm Ar. More preferably, the etchant gas includes $C_4F_8$, $SO_2$, $O_2$ and Ar supplied to the plasma etch reactor at flow rates of 10 to 20 sccm $C_4F_8$, 4 to 10 sccm $SO_2$, 4 to 10 sccm $O_2$, and 450 to 550 sccm Ar.

According to one aspect of the invention, the dielectric layer comprises a doped or undoped silicon dioxide, BPSG, BSG, FSG, PSG, TEOS, thermal silicon oxide or inorganic low-k material or organic low-k material such as SiLK. The openings can comprise lines corresponding to a conductor pattern, via openings or contact openings. The openings can be etched in the dielectric layer so as to have a high aspect ratio such as 3:1 or above, preferably an aspect ratio of at least 5:1. The fluorocarbon reactant can be one or more hydrogen-free fluorocarbon gases selected from the group of $CF_4$, $C_2F_2$, $C_2F_4$, $C_3F_6$, $C_4F_6$, $C_4F_8$, $C_5F_8$ and $C_6F_6$ and/or hydrogen-containing fluorocarbon gases such as $C_2HF_5$, $CHF_3$, $CH_3F$, $C_3H_2F_6$, $C_3H_2F_4$, $C_3HF_5$, $C_3HF_7$, etc. The semiconductor substrate can include an electrically conductive or semiconductive layer such as a metal-containing layer selected from the group consisting of Al, Al alloys, Cu, Cu alloys, Ti, Ti alloys, doped or undoped polycrystalline or single crystal silicon, TiN, TiW, Mo, silicides of Ti, W, Co and/or Mo or alloys thereof, etc. The optional carrier gas can be selected from the group consisting of Ar, He, Ne, Kr, Xe or mixtures thereof. If desired, a stop and/or mask layer such as a silicon nitride, silicon carbide, silicon oxynitride, or the like can be provided over the dielectric layer and/or between the dielectric and conductive layer.

DETAILED DESCRIPTION OF THE INVENTION

Figure 1:
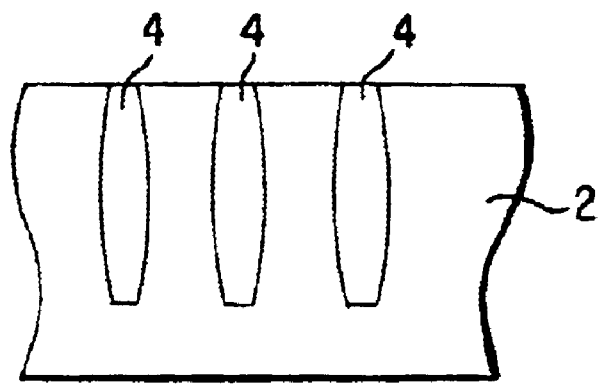
FIG. 1 shows an etched dielectric layer wherein deep high aspect ratio openings have bowed profiles.

The invention provides a semiconductor manufacturing process wherein deep openings can be plasma etched in dielectric layers while providing desired profile control. The dielectric layer can comprise silicon dioxide, SiLK, BPSG, BSG, FSG, PSG, OSG, and low-k materials. During manufacture of integrated circuits, features such as contacts, vias, conductor lines, etc. are etched in dielectric materials such as oxide layers. The invention overcomes a problem with prior etching techniques by increasing profile control during etching of deep openings having high aspect ratios.

The invention provides a process for plasma etching 0.3, especially 0.25 μm and smaller high aspect ratio features such as vias and contacts in silicon oxide layers on semiconductor substrates. In the process, a gas mixture containing fluorocarbon, sulfur and oxygen reactants is energized into a plasma state and during the etching process the sulfur and oxygen synergistically react to prevent polymer build-up from causing a phenomenon known as "etch stop." Etch stop is a problem which occurs during plasma etching of deep and narrow openings in silicon oxide using gas chemistries which form too much polymer, i.e., polymer-build-up in the opening prevents further etching of the silicon oxide. In the process of the invention, the polymer build-up can be reduced by the synergistic effect of breaking up the polymer with the oxygen and sulfur in the etching gas mixture.

According to the invention, oxygen- and sulfur-containing gases are added in amounts effective to control the profile of the etched opening. For instance, by adjusting the amount of sulfur relative to the amount of oxygen it is possible to form straight openings. On the other hand, by decreasing or eliminating oxygen in the etching gas mixture it is possible to form tapered openings. As an example, a tapered opening varying in size from 0.3 μm at the top to 0.1 μm at the bottom can be formed using an oxygen-free etching gas mixture of $C_4F_8$, Ar and $SO_2$. For straight openings, the preferred amount of the oxygen-containing gas is 50 to 200%, more preferably 75 to 125% of the amount of the sulfur-containing gas. However, it is advantageous if the amount of the oxygen-containing gas is higher for dielectric layers less dopant additions.

The oxygen-containing gas can be supplied to the plasma etching reactor in amounts effective to cut through polymer at the bottom of the etched opening. For a reactor which forms a medium density plasma, in the case where the oxygen-containing gas comprises $O_2$, the $O_2$ can be supplied to the reactor at a flow rate of 1 to 30 sccm, preferably 3 to 15 sccm. In the case where the sulfur-containing gas comprises $SO_2$, the $SO_2$ can be added at a flow rate of 1 to 30 sccm, preferably 3 to 15 sccm. The carrier gas preferably comprises Ar which can be added at a flow rate of 10 to 1000 sccm, preferably 100 to 750 sccm.

In order to obtain openings with straight sidewalls it is desirable to control the oxygen addition such that enough polymer is present to avoid or minimize bowing and enough polymer is removed to avoid the etch stop phenomenon. With respect to polymer removal, the effect of the oxygen is balanced by the sulfur addition. For instance, when using $SO_2$ it is possible to provide adequate sidewall passivation of the etched opening, i.e., provide polymer buildup of a desired thickness. Accordingly, by selectively adjusting the $O_2$ and $SO_2$ flow rates it is possible to obtain straight and narrow high aspect ratio openings.

The etching gas mixture preferably includes an inert carrier gas. Argon is an especially useful inert carrier gas which aids fluorine in attacking the silicon oxide. However, other inert gases such as He, Ne, Kr and/or Xe can be used as the carrier gas. In the case of using a high density etch reactor operated at low chamber pressures, to maintain the desired pressure in the plasma etching reactor it is preferable to control the amount of carrier gas introduced into the reactor to be at lower levels while still maintaining the plasma. For a medium density plasma reactor, however, argon can be supplied at higher rates into the reactor in amounts of 150 to 300 sccm. The carrier gas preferably aids the oxide etching rate due to sputtering of the oxide.

The fluorocarbon can be hydrogen-free and/or contain hydrogen. The amount of fluorocarbon gas to be supplied to the plasma reactor should be sufficient to achieve the desired degree of polymerizing. As an example, in a medium density plasma reactor, the total fluorocarbon gas can be supplied in amounts of 3 to 100 sccm, preferably 5 to 25 sccm, and more preferably 10 to 20 sccm.

The process of the invention is useful for obtaining extremely high aspect ratios of at least 5:1, preferably 10:1 and more preferably 20:1 or higher. The process is especially useful for obtaining aspect ratios up to 10:1 for openings smaller than 0.3 µm. For example, it is possible to obtain straight walls for 0.25 µm openings at depths greater than 2.1 µm.

The reactor pressure is preferably maintained as low as possible. In general, too low a reactor pressure can lead to plasma extinguishment whereas too high a reactor pressure can lead to the etch stop problem. For medium density plasma reactors such as a dual frequency capacitively coupled etch reactor, the reactor is preferably at a pressure below 200 mTorr such as 20 to 40 mTorr. Due to plasma confinement at the semiconductor substrate undergoing etching, the pressure at the substrate surface may range from 30 to 100 mTorr, e.g., 45 to 65 mTorr.

The substrate support supporting the semiconductor substrate undergoing etching preferably cools the substrate enough to prevent burning of any photoresist on the substrate, e.g., maintain the substrate below 140° C. In medium density plasma reactors, it is sufficient to cool the substrate support to a temperature of −20 to +80° C. In a dual plate plasma reactor or triode type reactor, the substrate support can comprise a bottom electrode such as an ESC on which a substrate such as a silicon wafer is electrostatically clamped and cooled by supplying helium at a desired pressure between the wafer and top surface of the ESC. In order to maintain the wafer at a desired temperature of, for example, 60 to 120° C., the He can be maintained at a pressure of 2 to 30 Torr in the space between the wafer and the chuck.

The plasma reactor preferably comprises a medium density parallel plate or triode type plasma reactor. In such reactors, it is desirable to maintain the gap between the top electrode and the bottom electrode supporting the semiconductor substrate at a distance of about 1.3 to 2.5 cm. The total power supplied to the top and bottom electrodes can be in the range of about 1000 to 4000 watts.

The process of the invention is applicable to etching of various dielectric layers such as doped silicon oxide such as fluorinated silicon oxide (FSG), undoped silicon oxide such as silicon dioxide, spin-on-glass (SOG), silicate glasses such as boron phosphate silicate glass (BPSG) and phosphate silicate glass (PSG), doped or undoped thermally grown silicon oxide, doped or undoped TEOS deposited silicon oxide, low-k dielectrics including inorganic materials and organic polymer materials, etc. The dielectric dopants include boron, phosphorus and/or arsenic. The dielectric can overlie a conductive or semiconductive layer such as polycrystalline silicon, metals such as aluminum, copper, titanium, tungsten, molybdenum or alloys thereof, nitrides such as titanium nitride, metal silicides such as titanium silicide, cobalt silicide, tungsten silicide, molybdenum silicide, etc. A silicon nitride layer can be provided over the dielectric layer and/or between the dielectric and conductive/semiconductive layers.

The plasma can be produced in various types of plasma reactors. Such plasma reactors typically have energy sources which use RF energy, microwave energy, magnetic fields, etc. to produce a medium to high density plasma. For instance, a high density plasma could be produced in a transformer coupled plasma (TCP™) available from Lam Research Corporation which is also called inductively coupled plasma reactor, an electron-cyclotron resonance (ECR) plasma reactor, a helicon plasma reactor, or the like. An example of a high flow plasma reactor which can provide a high density plasma is disclosed in commonly owned U.S. Pat. No. 5,820,261, the disclosure of which is hereby incorporated by reference. The plasma can also be produced in a parallel plate etch reactor such as the dual frequency plasma etch reactor described in commonly owned U.S. Pat. No. 6,090,304, the disclosure of which is hereby incorporated by reference.

In one embodiment, the invention provides a process for plasma etching high aspect ratio features such as conductor lines, vias and contacts including self aligned contacts (SAC) in dielectric layers on semiconductor substrates. In the process, a gas mixture containing fluorocarbon, oxygen, sulfur dioxide and optional gases such as a carrier gas (e.g., argon) is energized in a plasma etch reactor into a plasma state such that the fluorocarbon, the oxygen and sulfur dioxide reactants are at least partially dissociated. During the etching process, the dielectric layer is etched by fluorine containing species and the carbon forms a protective polymer on sidewalls of the etched openings. The oxygen and sulfur dioxide cooperate to balance polymer build-up sufficiently to protect sidewalls of etched features while avoiding pinch-off and etch stop problems due to excessive polymer build-up. In general, sulfur dioxide can be used to react with bottom polymer in the etched openings and the oxygen is added in an amount sufficient to control polymer buildup on the sidewalls of the etched openings. For etching deep and narrow openings in BPSG, for instance, it has been found desirable to add $SO_2$ and $O_2$ in about the same flow rates. For etching less doped materials such as undoped silicon dioxide, the $SO_2$ can be supplied at a lower flow rate than the $O_2$.

The ratio of oxygen to sulfur dioxide is preferably controlled to take into account the size of the features being etched and the film composition of the material being etched. For instance, when etching larger feature sizes less sulfur dioxide is needed to protect the sidewalls of the etched openings. For dielectric materials which are softer due to doping of the material more sulfur dioxide can be used to provide greater sidewall protection. The advantageous effects of the invention can be achieved by supplying the oxygen reactant and fluorocarbon reactant to plasma etching reactor at a flow rate ratio of oxygen reactant to fluorocarbon reactant of 1.5 or less. For selective etching of BPSG in a medium density plasma etch reactor, the flow rate ratio of oxygen reactant to fluorocarbon reactant is preferably 0.25 to 0.75.

The fluorocarbon is preferably hydrogen-free and may comprise at least one of $CF_4$, $C_2F_2$, $C_2F_4$, $C_3F_6$, $C_4F_6$, $C_4F_8$, $C_5F_8$, $C_6F_6$, etc. The etching gas mixture may optionally include other gases and/or an inert carrier gas such as argon (Ar), helium (He), neon (Ne), krypton (Kr), xenon (Xe) and mixtures thereof. Argon is an especially useful inert carrier gas which aids fluorine in attacking dielectric materials such as silicon oxide. The argon can be supplied into the reactor in amounts of 0 to 1000 sccm, preferably 100 to 750 sccm. The carrier gas preferably aids the dielectric etch rate, e.g., the oxide etching rate can be increased due to sputtering of the oxide.

The amount of fluorocarbon gas to be supplied to the plasma reactor should be sufficient to achieve the desired degree of polymerizing. Oxygen and fluorocarbon reactants can each be supplied at flow rates of 5 to 100 sccm, preferably 5 to 50 sccm, and more preferably 5 to 20 sccm. As an example, the oxygen reactant flow rate can range from 5 to 20 sccm when $C_xF_y$ is supplied at 10 to 20 sccm, and argon, if supplied, can range from 100 to 600 sccm. In another example, the $C_xF_y$ is $C_4F_6$, the oxygen containing gas is $O_2$ and the $C_4F_6$ and $O_2$ are supplied to the plasma etch reactor at flow rates having a ratio of $C_4F_6$:$O_2$ of 1:1 to 2:1. In an additional example, the $C_4F_6$ and $O_2$ are supplied to the plasma etch reactor at flow rates to avoid etch stop during etching of the openings in a SAC or dual damascene structure. The $O_2$ can be supplemented or replaced with other oxygen containing gases such as CO. For instance, CO can be added to the etch gas at a flow rate of 50 to 500 sccm.

It will be apparent to those skilled in the art that the flow rates of the various gases will depend on factors such as the size of the substrate, the type of plasma reactor, the power settings, the vacuum pressure in the reactor, the dissociation rate for the plasma source, etc.

The process of the invention is useful for obtaining extremely deep and narrow openings with aspect ratios of at least 10:1, the process being especially useful for obtaining aspect ratios up to 10:1 for openings smaller than 0.3 $\mu$m, preferably as small as 0.18 $\mu$m and below. For example, in one embodiment, a dual frequency plasma etch reactor (such as the dual frequency plasma etch reactor described in commonly owned U.S. Pat. No. 6,090,304, the disclosure of which is hereby incorporated by reference) was operated with a top electrode power of 0 to 5000 watts, preferably 1000–2000 watts, and a bottom electrode power of 0 to 5000 watts, preferably 1000–2000 watts. For example, straight 0.25 $\mu$m openings having depths of about 3 $\mu$m can be etched in about 4 minutes in a single step with the chamber pressure set at about 30 mTorr, one or both of the electrodes powered with 1400 watts at 27 MHz and 1800 watts at 2 MHz, using an etch gas mixture of 500 sccm Ar, 6 sccm $O_2$, 6 sccm $SO_2$, and 15 sccm $C_4F_8$. Similar profiles could be obtained by increasing the $O_2$ and $SO_2$ flow rates while maintaining a flow rate ratio of about 1:1 or by increasing the $O_2$ flow rate with respect to the $SO_2$ flow rate, e.g., 9 sccm $O_2$ and 4.5 sccm $SO_2$.

Figure 2:
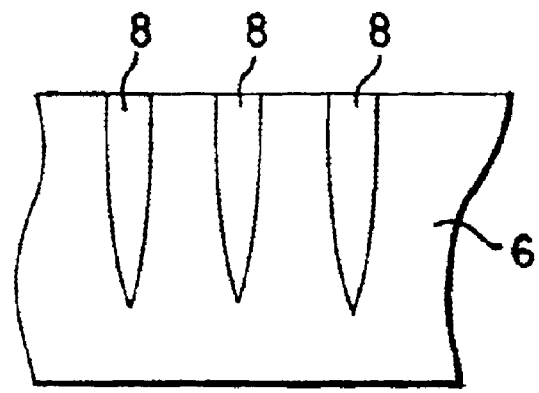
FIG. 2 shows an etched dielectric layer wherein deep high aspect ratio openings have tapered profiles.
Figure 3:
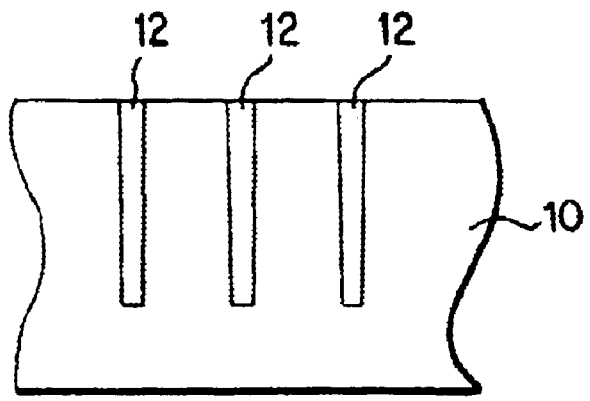
FIG. 3 shows an etched dielectric layer wherein deep high aspect ratio openings have straight profiles.

FIG. 1 illustrates the bowed etch profile obtained when using an etch gas mixture which includes $O_2$ but not $SO_2$ and FIG. 2 illustrates the tapered etch profile obtained when the etch gas mixture includes $SO_2$ but not $O_2$. In FIG. 1, a dielectric layer 2 having bowed openings 4 was obtained when the dielectric etch was carried out for about 4 minutes in a single step with the chamber pressure set at about 50 mTorr, one or both of the electrodes powered with 500watts at 27 MHz and2000 watts at 2 MHz, 500 sccm Ar, 7 sccm $O_2$, and 15 sccm $C_4F_8$. In FIG. 2, a dielectric layer 6 having tapered openings 8 was obtained when the dielectric etch was carried out an oxide etch can be carried out for about 4 minutes in a single step with the chamber pressure set at about 30 mTorr, one or both of the electrodes powered with 1400 watts at 27 MHz and 1800 watts at 2 MHz, 500 sccm Ar, 13 sccm $SO_2$, and 15 sccm $C_4F_8$. FIG. 3 shows an example of a dielectric layer 10 having straight openings 12, the openings being etched in accordance with the process according to the invention.

The reactor pressure is preferably maintained at a level suitable for sustaining a plasma in the reactor. In general, too low a reactor pressure can lead to plasma extinguishment whereas in a high density etch reactor too high a reactor pressure can lead to the etch stop problem. For high density plasma reactors, the reactor is preferably at a pressure below 30 mTorr, more preferably below 10 mTorr. For medium density plasma reactors, the reactor is preferably at a pressure from 20 to 100 mTorr. Due to plasma confinement at the semiconductor substrate undergoing etching, the vacuum pressure at the substrate surface may be higher than the vacuum pressure setting for the reactor.

The substrate support supporting the semiconductor substrate undergoing etching preferably cools the substrate enough to prevent deleterious side reactions such as burning of any photoresist on the substrate and formation of undesirable reactant gas radicals. In high and medium density plasma reactors, it is sufficient to cool the substrate support to a temperature of −20 to +80° C. The substrate support can include a bottom electrode for supplying an RF bias to the substrate during processing thereof and an ESC for clamping the substrate. For example, the substrate can comprise a silicon wafer which is electrostatically clamped and cooled by supplying helium (He) at a desired pressure between the wafer and top surface of the ESC. In order to maintain the wafer at a desired temperature of the He can be maintained at a pressure of 10 to 30 Torr in the space between the wafer and the chuck.

The foregoing has described the principles, preferred embodiments and modes of operation of the present invention. However, the invention should not be construed as being limited to the particular embodiments discussed. Thus, the above-described embodiments should be regarded as illustrative rather than restrictive, and it should be appreciated that variations may be made in those embodiments by workers skilled in the art without departing from the scope of the present invention as defined by the following claims.

What is claimed is:

1. A method of etching openings in a dielectric layer with profile control, comprising:
   supporting a semiconductor substrate in a plasma etch reactor, the substrate including a dielectric layer;
   supplying an etchant gas to the plasma etch reactor; and
   etching openings in the dielectric layer by energizing the etchant gas into a plasma state, the etchant gas comprising $C_xF_yH_z$ wherein $x \geq 1$, $y \geq 1$ and $z \geq 0$, $SO_2$ gas and an oxygen-containing gas, the $SO_2$ gas and the oxygen-containing gas being added in amounts effective for profile control of the etched openings.

2. The method of claim 1, wherein the openings comprise vias, contacts, and/or trenches of a dual damascene, self-aligned contact or self-aligned trench structure.

3. The method of claim 1, wherein the $C_xF_yH_z$ forms a protective sidewall polymer on sidewalls of the etched openings, the $SO_2$ gas protects the sidewall polymer from excessive attack by the oxygen-containing gas and the oxygen-containing gas maintains a thickness of the sidewall polymer effective for profile control of the etched openings.

4. The method of claim 1, wherein the plasma etch reactor comprises an ECR plasma reactor, an inductively coupled plasma reactor, a capacitively coupled plasma reactor, a helicon plasma reactor or a magnetron plasma reactor.

5. The method of claim 1, wherein the plasma etch reactor comprises a dual frequency capacitively coupled plasma reactor including an upper showerhead electrode and a bottom electrode, RF energy being supplied at two different frequencies to either the bottom electrode or at different first and second frequencies to the showerhead electrode and bottom electrode.

6. The method of claim 1, wherein the oxygen-containing gas is $O_2$, the $SO_2$ and $O_2$ being added in amounts effective to provide undissociated $SO_2$ molecules which react with polymer at bottoms of the etched openings to prevent etch stop under bombardment of directional ions.

7. The method or claim 1, wherein the ratio of flow rates of the $SO_2$ gas to the oxygen-containing gas is 0.5:1 to 1.5:1.

8. The method of claim 1, wherein pressure in the plasma etch reactor is 5 to 200 mTorr and/or temperature of the substrate support is −20° C. to +80° C.

9. The method of claim 1, wherein the plasma etch reactor is a capacitively coupled plasma reactor having a powered showerhead electrode and a powered bottom electrode, the showerhead electrode being supplied 500 to 3000 watts of RF energy and the bottom electrode being supplied 500 to 3000 watts of RE energy.

10. The method of claim 1, wherein the etchant gas includes a carrier gas selected from the group consisting of He, Ne, Kr, Xe and Ar, the carrier gas being supplied to the plasma etch reactor at a flow rate of 5 to 1000 sccm.

11. The method of claim 1, wherein the dielectric layer comprises a doped or undoped silicon dioxide, BPSG, BSG, FSG, PSG, TEOS, thermal silicon oxide or inorganic low-k material or organic low-k material, the dielectric layer overlying a conductive layer selected from the group consisting of Al, Al alloys, Cu, Cu alloys, Ti, Ti alloys, doped or undoped polycrystalline or single crystal silicon, TiN, TiW, Mo, silicides of Ti, W, Co and/or Mo or alloys thereof, the semiconductor substrate including an optional stop layer and/or mash layer selected from silicon nitride, silicon carbide or silicon oxynitride over the dielectric layer and/or between the dielectric and conductive layer.

12. The method of claim 1, wherein the oxygen-containing gas is $O_2$, each of the $SO_2$ and $O_2$ gases being supplied to the plasma etch reactor at a flow rate of 1 to 30 sccm.

13. The method at claim 1, wherein the dielectric layer is BPSG and the etchant gas includes $SO_2$ and $O_2$ supplied to the plasma etch reactor with flow rates providing a $SO_2$: $O_2$ flow rate ratio of 1:2 to 2:1.

14. The method of claim 1, wherein the etched openings are 0.30 μm or smaller sized openings having substantially straight profiles wherein top, middle and bottom critical dimensions of the openings are substantially the same, and the openings have an aspect ratio of at least 5:1.

15. The method of claim 1, wherein the dielectric layer includes a stack of layers of low-k materials with or without etch stop layers therebetween, the openings being etched to depths of at least 2 μm.

16. The method of claim 1, wherein an RF bias is applied to the semiconductor substrate during the etching step.

17. The method of claim 1, wherein the etched openings are 0.25 μm or smaller sized openings having substantially straight profiles wherein top, middle and bottom critical dimensions of the openings are substantially the same, and the openings have an aspect ratio of a least 10:1.

18. The method of claim 1, wherein the etchant gas includes $C_4F_8$, $SO_2$, $O_2$ and Ar supplied to the plasma etch reactor at flow rates of 5 to 30 sccm $C_4F_8$, 2 to 15 sccm $SO_2$, 2 to 15 sccm $O_2$, and 300 to 600 sccm Ar.

19. The method of claim 1, wherein the etchant gas includes $C_4F_8$, $SO_2$, $O_2$ and Ar supplied to the plasma etch reactor at flow rates of 10 to 20 sccm $C_4F_8$, 4 to 10 sccm $SO_2$, 4 to 10 sccm $O_2$, and 450 to 550 sccm Ar.

20. The method of claim 1, wherein $C_xF_yH_z$ comprises at least one hydrogen-free fluorocarbon selected from $CF_4$, $C_2F_2$, $C_2F_4$, $C_3F_6$, $C_4F_6$, $C_4F_8$ and $C_6F_6$ and/or at least one hydrogen containing fluorocarbon selected from $C_2HF_3$, $CHF_3$, $CH_3F$, $C_3H_2F_0$, $C_3H_2F_4$, $C_3HF_5$, $C_3HF_7$.

* * * * *